(12) United States Patent
Park et al.

(10) Patent No.: US 10,502,481 B2
(45) Date of Patent: *Dec. 10, 2019

(54) REFRIGERATOR

(71) Applicant: LG ELECTRONICS INC., Seoul (KR)

(72) Inventors: Shinhyun Park, Seoul (KR); Sun Kim, Seoul (KR); Byoungsuk Choi, Seoul (KR); Jinseok Hu, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 191 days.

This patent is subject to a terminal disclaimer.

(21) Appl. No.: 15/542,048

(22) PCT Filed: Apr. 26, 2016

(86) PCT No.: PCT/KR2016/004319
§ 371 (c)(1),
(2) Date: Jul. 6, 2017

(87) PCT Pub. No.: WO2017/022930
PCT Pub. Date: Feb. 9, 2017

(65) Prior Publication Data
US 2018/0023885 A1    Jan. 25, 2018

(30) Foreign Application Priority Data

Jul. 31, 2015  (KR) .................. 10-2015-0109226

(51) Int. Cl.
F25D 29/00      (2006.01)
H02J 9/06       (2006.01)
(Continued)

(52) U.S. Cl.
CPC .......... *F25D 29/006* (2013.01); *F25B 49/005* (2013.01); *G01R 19/04* (2013.01); *H02J 9/062* (2013.01); *F25B 2600/01* (2013.01); *F25B 2700/15* (2013.01); *F25D 21/006* (2013.01); *F25D 2600/02* (2013.01); *Y02B 10/72* (2013.01)

(58) Field of Classification Search
CPC .......................... F25D 29/006; F25B 2700/15
See application file for complete search history.

(56) References Cited

U.S. PATENT DOCUMENTS 10,027,164 B2 * 7/2018 Hu .................... H02J 9/061
2006/0260335 A1  11/2006 Montuoro et al.
(Continued)

FOREIGN PATENT DOCUMENTS

EP    1 851 842 A2   11/2007
EP    2 879 263 A1    6/2015
(Continued)

*Primary Examiner* — Christopher E Mahoney
(74) *Attorney, Agent, or Firm* — Dentons US LLP

(57) ABSTRACT

A refrigerator according to an embodiment of the present invention includes a power input part through which power is input from a UPS device connected to a commercial power source and an auxiliary power source; a voltage sensor configured to sense a voltage of the power input through the power input part; and a control part configured to analyze a voltage signal sensed by the voltage sensor and to determine whether the input power is commercial power or auxiliary power.

10 Claims, 14 Drawing Sheets

(51) Int. Cl.
*F25B 49/00* (2006.01)
*G01R 19/04* (2006.01)
*F25D 21/00* (2006.01)

(56) References Cited

U.S. PATENT DOCUMENTS

| | | | |
|---|---|---|---|
| 2012/0206108 A1* | 8/2012 | Waring | H02J 3/14 320/137 |
| 2013/0098089 A1 | 4/2013 | Jeong et al. | |

FOREIGN PATENT DOCUMENTS

| | | |
|---|---|---|
| JP | 7-67269 A | 3/1995 |
| JP | 2008020120 A | 1/2008 |
| KR | 10-1997-0075804 A | 12/1997 |
| KR | 10-1353981 B1 | 1/2014 |
| KR | 10-2014-0047949 A | 4/2014 |
| KR | 20-2014-0003317 U | 6/2014 |

* cited by examiner

【Figure 1】
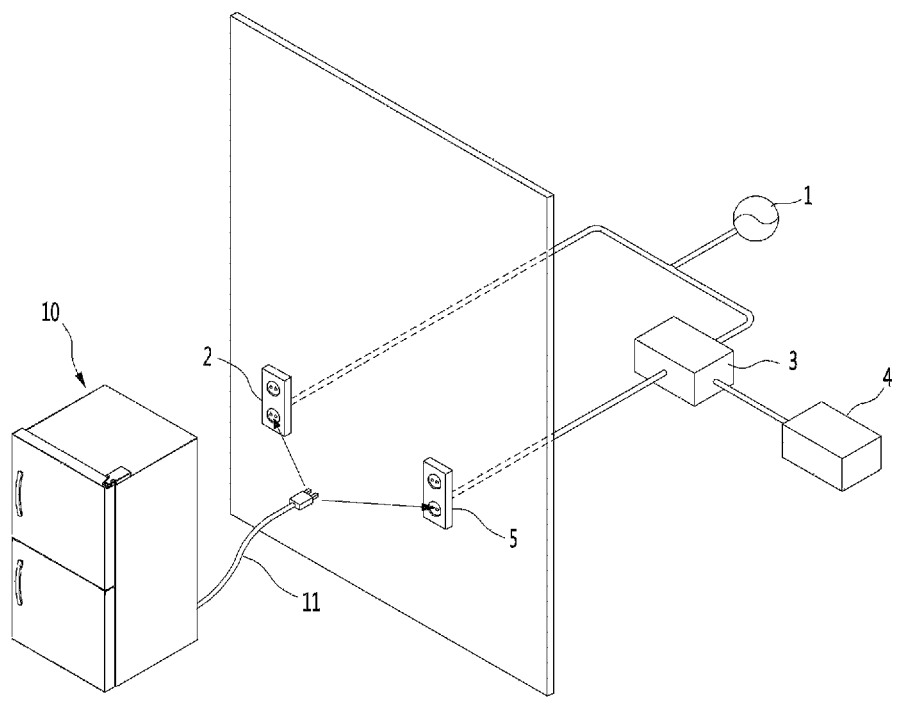

【Figure 2】
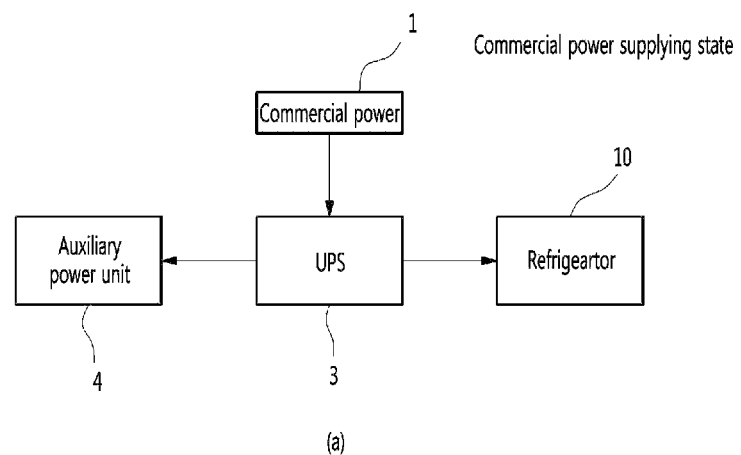
(a)
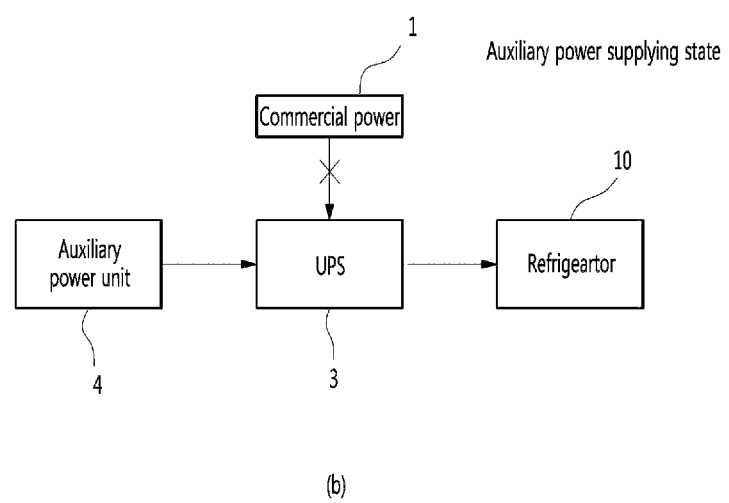
(b)

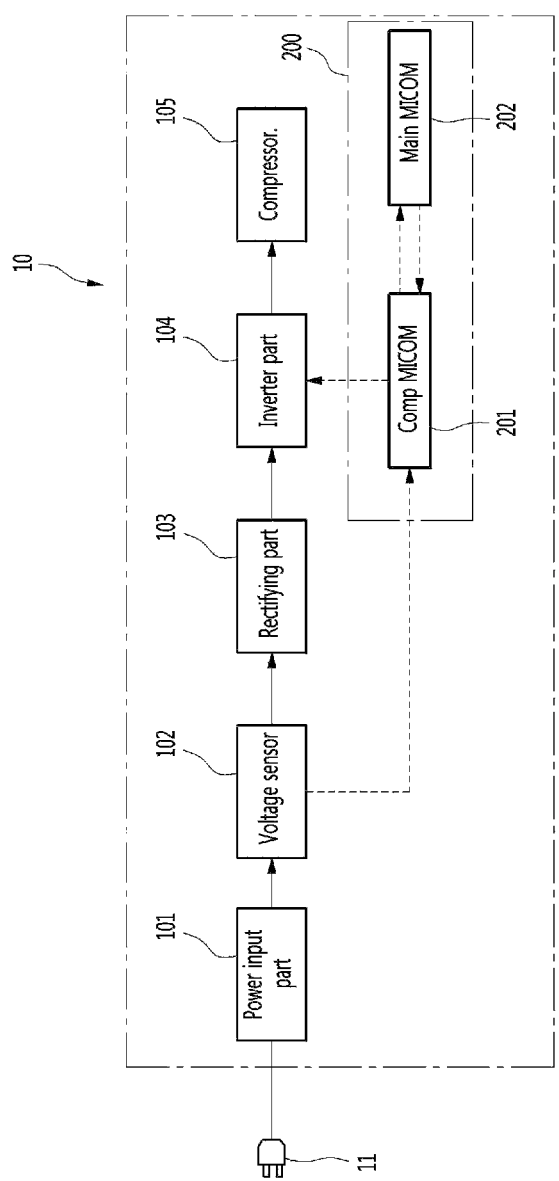
[Figure 3]

【Figure 4】
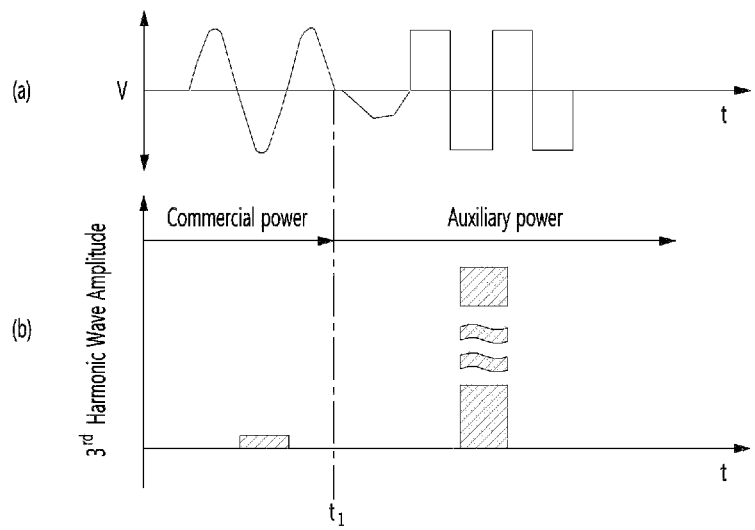
【Figure 5】
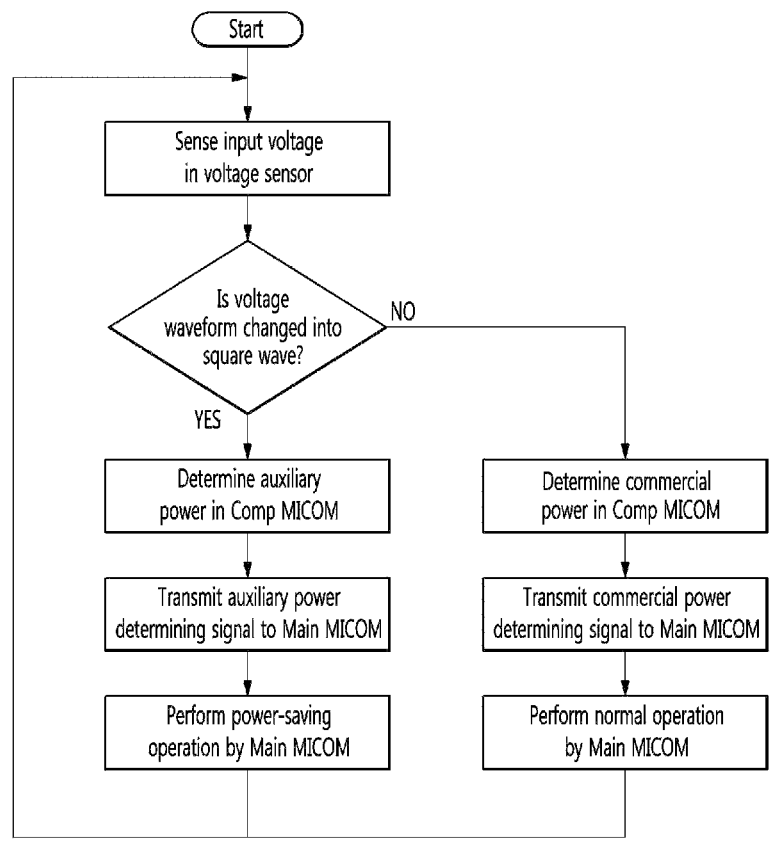

[Figure 6]
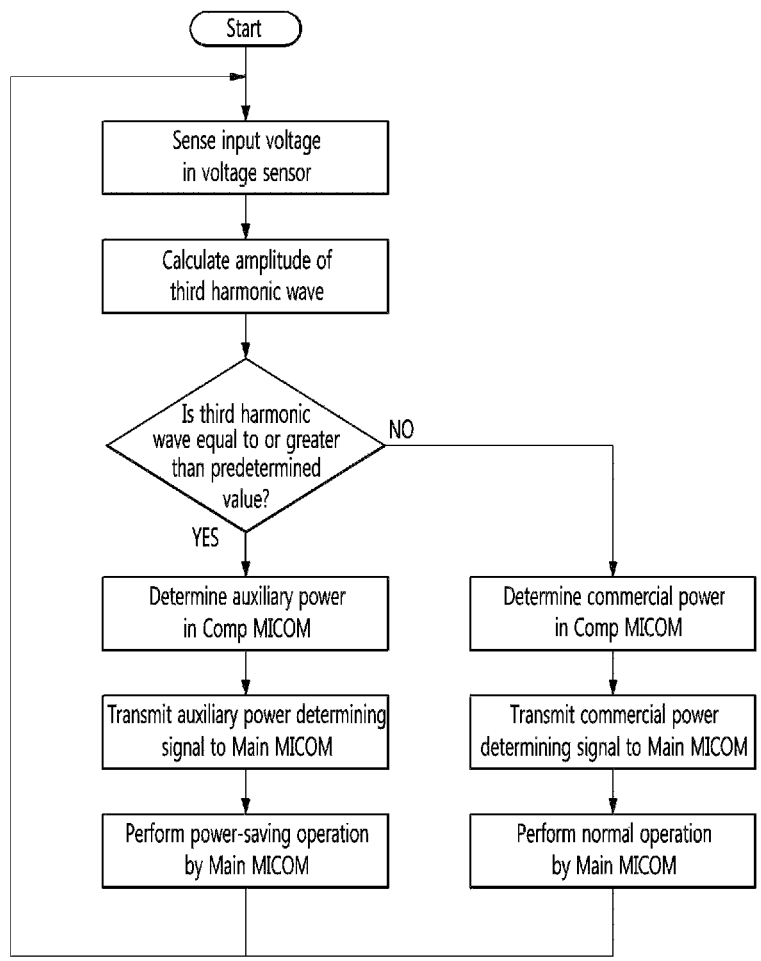

【Figure 7】
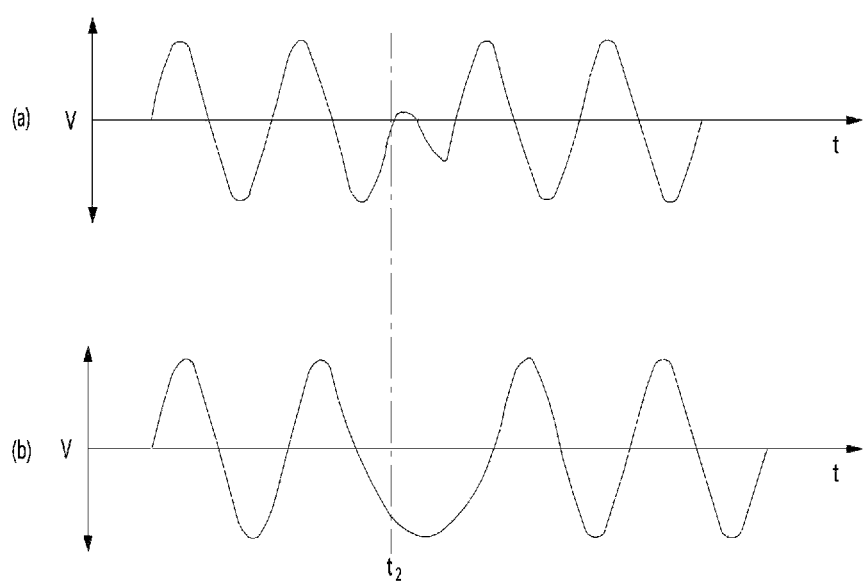

[Figure 8]
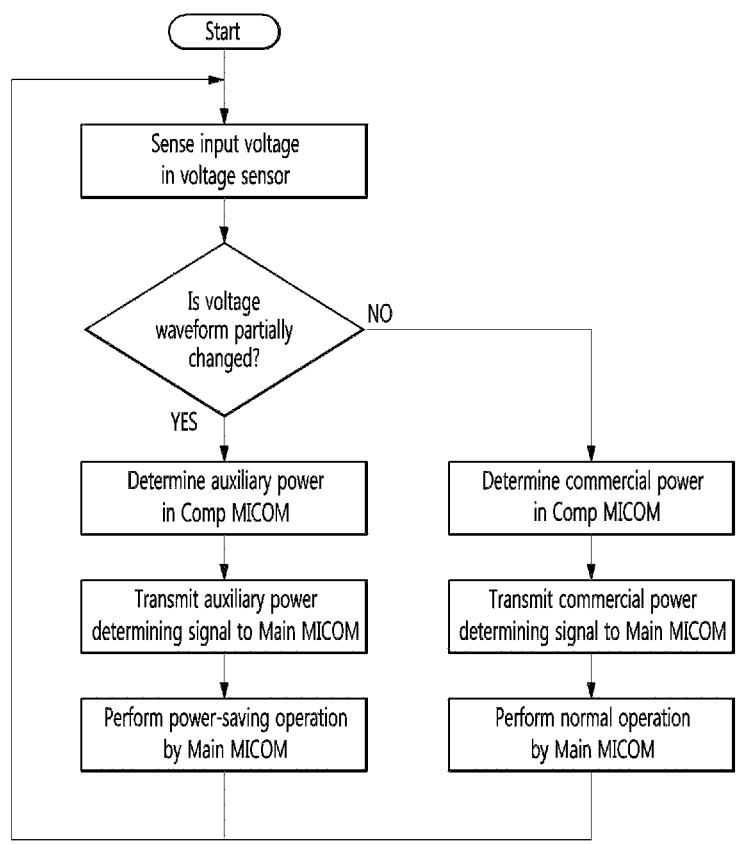

[Figure 9]
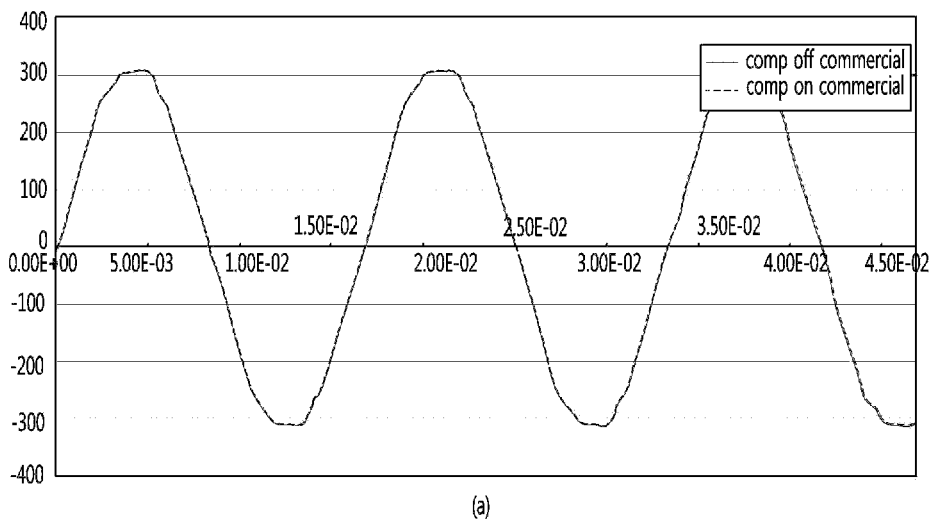
(a)
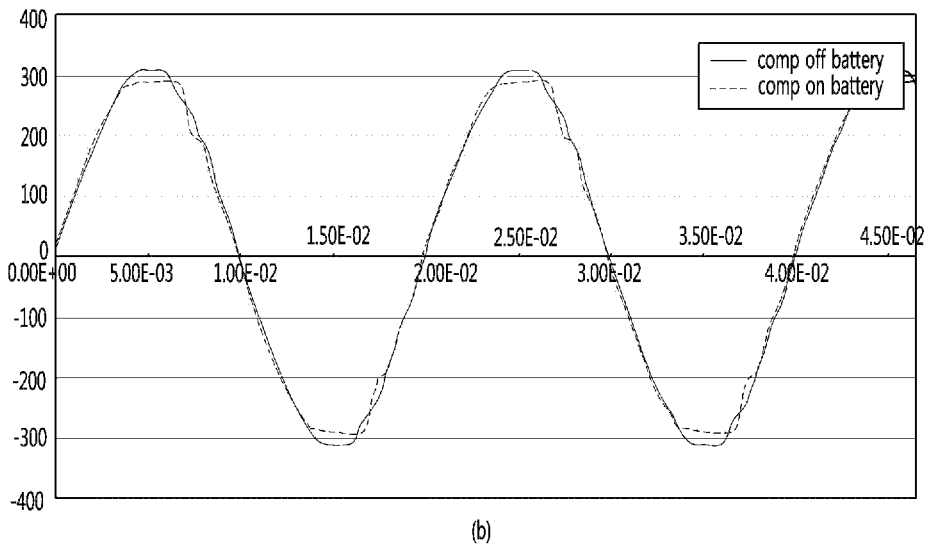
(b)

[Figure 10]
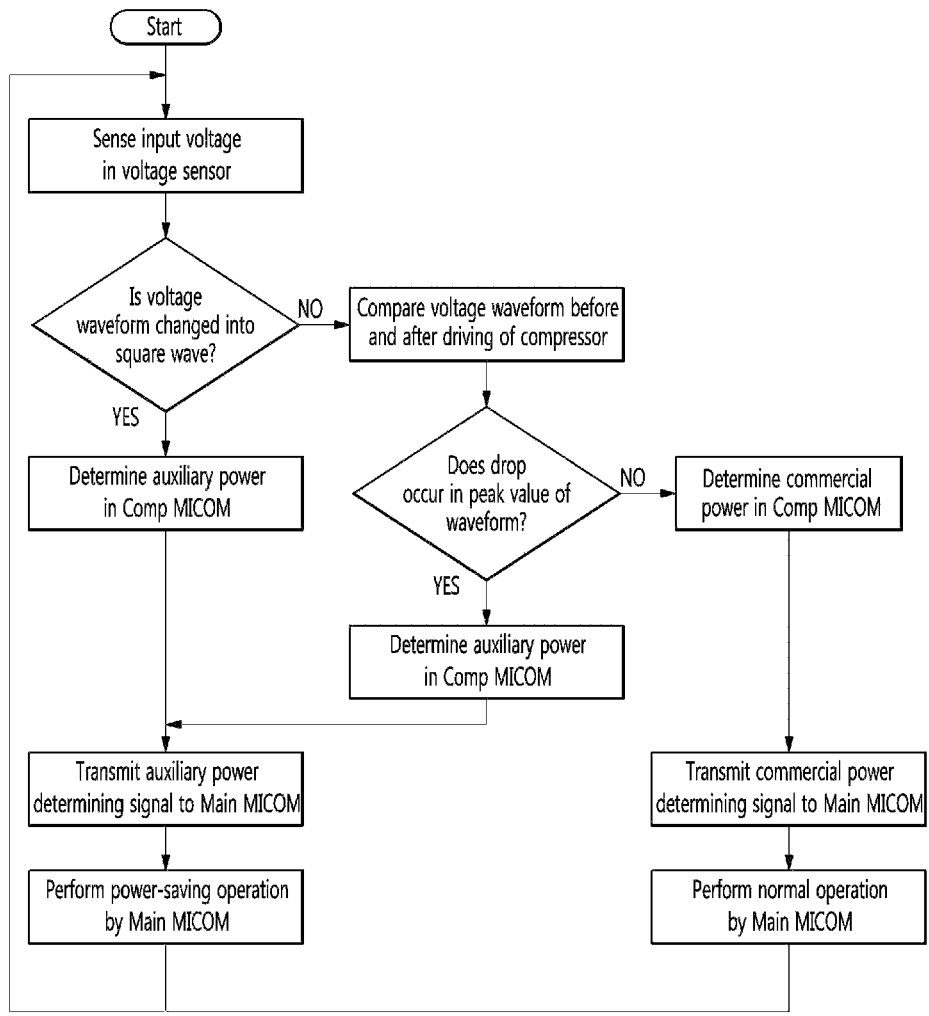

【Figure 11】
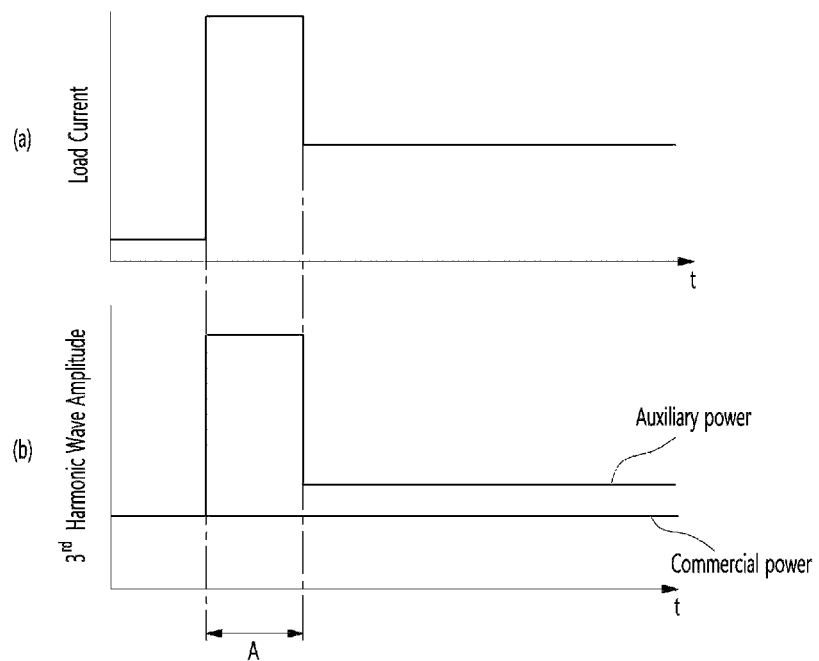

[Figure 12]
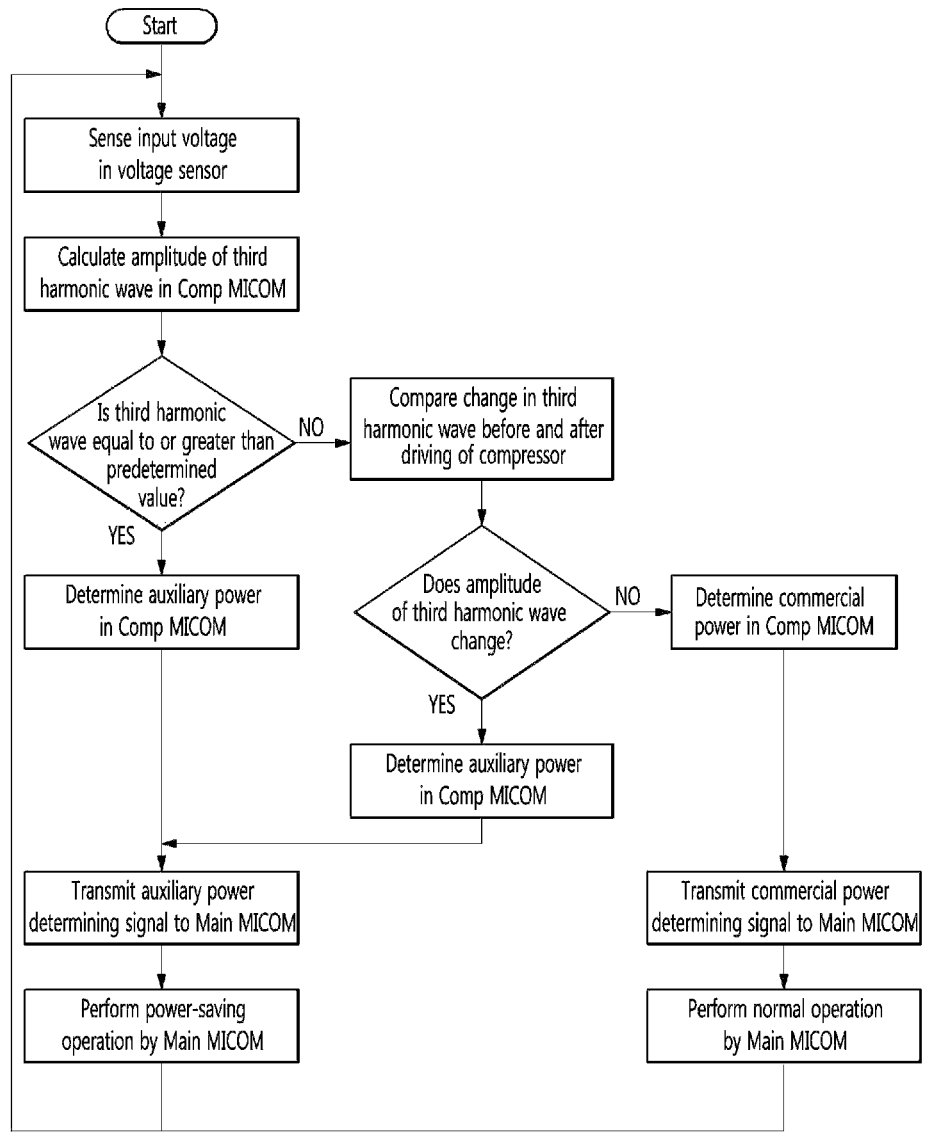

【Figure 13】
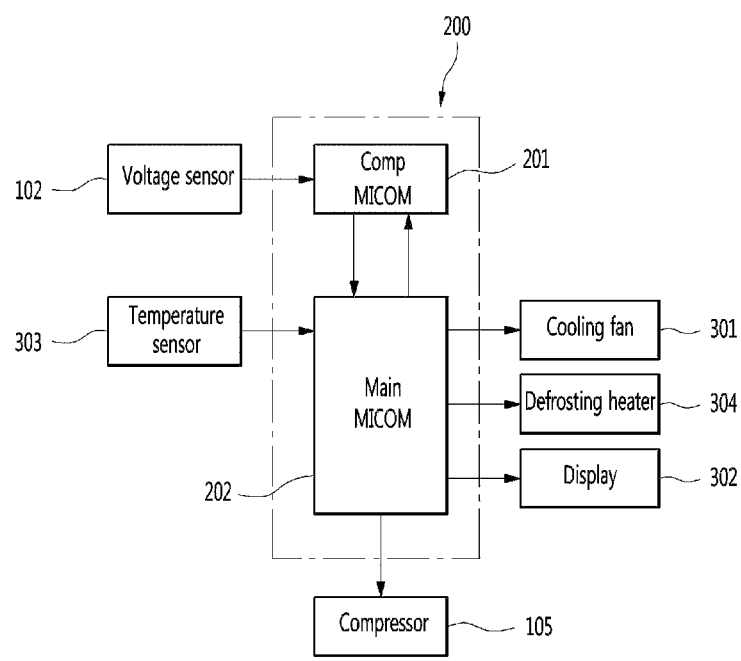

【Figure 14】
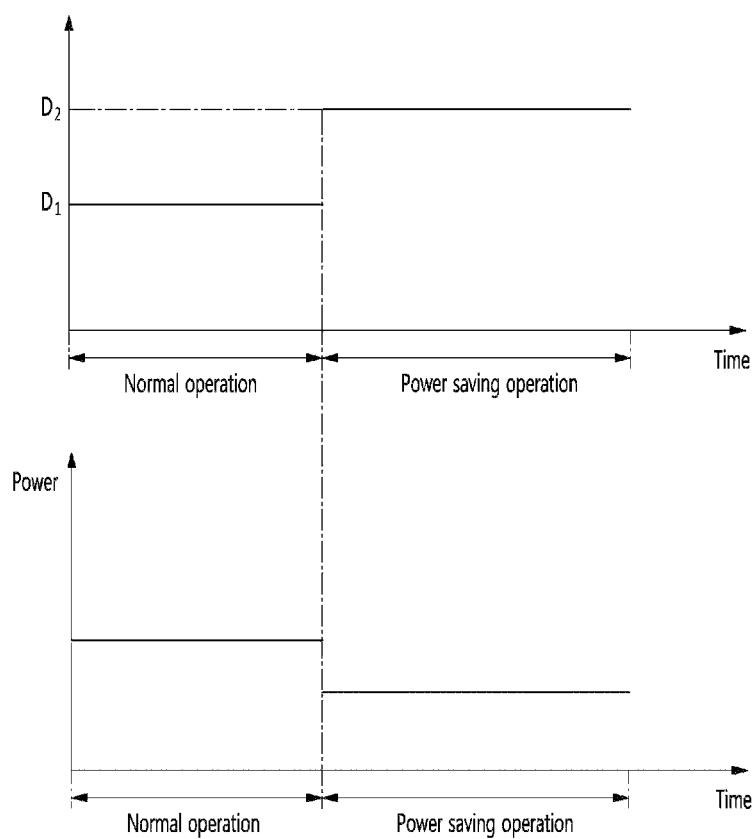

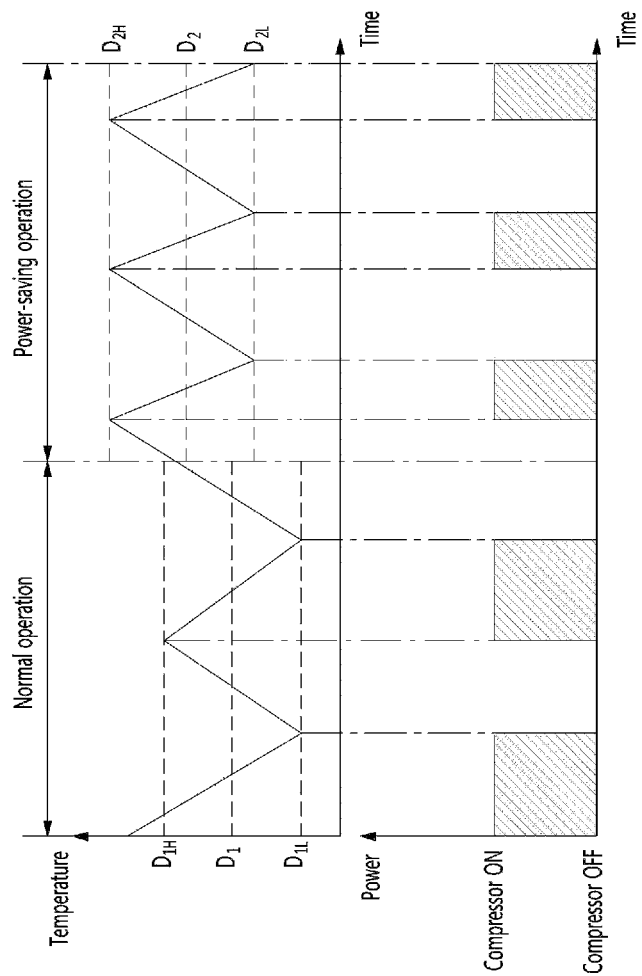
[Figure 15]

REFRIGERATOR

This application is a National Stage Application of International Application No. PCT/KR2016/004319, filed on Apr. 26, 2016, which claims the benefit of Korean Patent Application No. 10-2015-0109226, filed on Jul. 31, 2015, all of which are hereby incorporated by reference in their entirety for all purposes as if fully set forth herein.

TECHNICAL FIELD

The present invention relates to a refrigerator.

BACKGROUND ART

Generally, a refrigerator is a home appliance which stores food at a low temperature in a storage space formed therein to be opened and closed by a door. To this end, the refrigerator is formed to cool an inside of the storage space using cooling air generated through heat exchange with a refrigerant circulated in a refrigeration cycle, and thus to keep the stored food in an optimum state.

In the refrigerator, a temperature in the refrigerator is maintained at a set temperature to keep the food stored therein in the optimum state according to a use characteristic.

To this end, electric power should be always supplied to the refrigerator, and a compressor, a fan, a damper and so on should be driven to check a temperature state in the refrigerator and to maintain the set temperature.

Meanwhile, when a power outage occurs while the refrigerator is being used, an operation of all of electronic components in the refrigerator including the compressor, the fan, the damper and so on is stopped, and thus a cooling operation in the refrigerator may not be performed. When a power outage state becomes longer or a door of the refrigerator is opened and closed, the temperature in the refrigerator is increased, and thus there are some problems that, for example, the stored food may spoil.

To prepare for the power outage state, there has been developed a refrigerator in which a cold storage material is provided therein, and an inside of the refrigerator is cooled using the cold storage material while a refrigeration cycle is not driven.

However, such a refrigerator may temporarily maintain cooling performance, but the cooling performance of the cold storage material is continuously lowered, and thus cooling efficiency is degraded.

DISCLOSURE

Technical Problem

The present invention is directed to providing a refrigerator which is connected to an uninterruptible power supply (UPS) device so that a cooling operation is performed by auxiliary power when a power outage in which commercial power supply is cut occurs, and also which is able to accurately determine whether commercial power or the auxiliary power is input.

Also, the present invention is directed to providing a refrigerator which is operated with a low power consumption using the auxiliary power when input power is determined as the auxiliary power.

Technical Solution

One aspect of the present invention provides a refrigerator including a power input part through which power is input from a UPS device connected to a commercial power source and an auxiliary power source; a voltage sensor configured to sense a voltage of the power input through the power input part; and a control part configured to analyze a voltage signal sensed by the voltage sensor and to determine whether the input power is commercial power or auxiliary power.

The refrigerator may further include a compressor, and the control part may measure a change of the voltage before and after driving of the compressor and may determine whether the power is the commercial power or the auxiliary power.

The refrigerator may further include a compressor, and the control part may determine that the power is the auxiliary power when a change in amplitude of a third harmonic wave before and after driving of the compressor is equal to or more than a predetermined value.

The refrigerator may further include an inverter compressor, and the control part may determine that the power is the auxiliary power when a change in amplitude of a third harmonic wave before and after driving of the compressor is equal to or more than a predetermined value.

The amplitude of the third harmonic wave after the driving may be amplitude of the third harmonic wave at an initial operation of the compressor.

The control part may determine that the power is the auxiliary power when the amplitude of the third harmonic wave sensed before the driving is smaller than that of the third harmonic wave at an initial operation.

The control part may include a comp microcomputer which calculates a voltage signal transmitted from the voltage sensor, determines whether the auxiliary power is input, and controls driving of the compressor; and a main microcomputer which is connected to the comp microcomputer by a photo-coupler, and determines an operation mode of the refrigerator according to an auxiliary power input signal received from the comp microcomputer.

The control part may calculate amplitude of a third harmonic wave of the voltage input from the voltage sensor, and may determine that the power is the auxiliary power when the amplitude of the third harmonic wave is equal to or more than a predetermined value.

The control part may determine that the power is the auxiliary power when a waveform of the voltage input from the voltage sensor is changed.

The refrigerator may further include a compressor, and the control part may determine that the power is the auxiliary power when a peak value of a voltage waveform when driving of the compressor starts is dropped.

When it is determined that the input power is the auxiliary power, the control part may increase a control reference set temperature in the refrigerator, and may operate the refrigerator.

The voltage sensor may be supplied on a power line through which the power is supplied from the power input part to the compressor, and may sense a voltage signal supplied to the compressor.

The voltage sensor may be configured with a resistor connected to the power input part.

The UPS device may be integrally formed with the refrigerator.

A display which displays a change in a power input state when the control part determines that the auxiliary power is input may be provided.

The auxiliary power source may be one of a battery, a chargeable battery, an energy storage unit, a solar heat (light) cell and an independent generator.

The auxiliary power may be input in a power outage situation in which the commercial power is cut off.

The auxiliary power may be input at a predetermined power peak time.

The power peak time may be directly set in the UPS device by a user.

The power peak time may be set through the refrigerator located at a distant place or a terminal which is able to communicate by a user.

The power peak time may be set in a server which is able to communicate with a distance place by a power supplier.

Another aspect of the present invention provides a refrigerator including a power input part connected to a UPS device which is connected to an auxiliary power source and a commercial power source and selectively supplies power; a compressor; a voltage sensor configured to sense a voltage input through the power input part; and a control part configured to analyze a voltage signal sensed by the voltage sensor and to determine whether the input power is commercial power or auxiliary power, wherein the control part performs a primary determination through an analysis of the sensed voltage signal, performs a secondary determination through the analysis of the voltage signal sensed before and after driving of the compressor when it is determined that the power is not the auxiliary power, and determines whether the input power is the commercial power or the auxiliary power.

In the primary determination, when a waveform of the voltage signal sensed by the voltage sensor is a square wave, the control part may determine that the input power is the auxiliary power.

In the secondary determination, when a peak value of a voltage waveform of the compressor is dropped, the control part may determine that the input power is the auxiliary power.

In the secondary determination, when amplitude of a third harmonic wave after the driving of the compressor is greater than that of the third harmonic wave before the driving of the compressor, the control part may determine that the input power is the auxiliary power.

In the primary determination, when amplitude of a third harmonic wave of the voltage signal sensed by the voltage sensor is equal to or more than a predetermined value, the control part may determine that the input power is the auxiliary power.

In the secondary determination, when a peak value of a voltage waveform of the compressor is dropped, the control part may determine that the input power is the auxiliary power.

In the secondary determination, when the amplitude of the third harmonic wave after the driving of the compressor is greater than that of the third harmonic wave before the driving of the compressor, the control part may determine that the input power is the auxiliary power.

The compressor may be an inverter compressor, and a point of time after the driving of the compressor may be an initial operation time in which a position of a rotor is aligned when the driving of the compressor starts.

The voltage sensor may be supplied on a power line through which the power is supplied from the power input part to the compressor, and may sense the voltage signal supplied to the compressor.

In the primary determination of the control part, when it is determined that the input power is the auxiliary power, the determination of the control part may be terminated.

Still another aspect of the present invention provides a refrigerator including a compressor; a power input part through which power is input from a UPS device connected to a commercial power source and an auxiliary power source; a voltage sensor configured to sense a voltage of the power input through the power input part; and a control part configured to analyze a voltage signal sensed by the voltage sensor, to determine whether input power is commercial power or auxiliary power, and to control driving of the compressor, wherein, when it is determined that the auxiliary power is input, the control part controls an operation to be switched from a normal operation mode to a power-saving operation mode in which a power consumption is relatively saved.

The power-saving operation mode may be operated at a set temperature higher than that of the normal operation mode.

The compressor may be an inverter compressor, and the control part may determine whether the input power is the auxiliary power at a point of time when the driving of the compressor starts.

The power-saving operation mode may control the compressor to be driven with the input power lower than that of the normal operation mode.

The power-saving operation mode may control a driving time of the compressor to be reduced per unit time further than that of the normal operation mode.

The power-saving operation mode may be controlled not to perform a defrosting operation even when it arrives at a preset defrosting time.

Advantageous Effects

In the refrigerator according to the embodiment of the present invention, the following effects can be expected.

First, when the commercial power is cut off, the auxiliary power can be immediately supplied by the UPS device, and thus the refrigerator can be continuously operated. Therefore, even in a power outage situation, stored food can be kept cooled.

Second, the refrigerator can determine whether the input power is the commercial power or the auxiliary power through sensing of the input voltage of the power input to the refrigerator, and when the input power is the auxiliary power, the refrigerator is switched to the power-saving operation mode having a low power consumption, and thus cooling performance can be stably maintained using the auxiliary power unit having a relatively small and limited capacity.

Third, since the inverter type compressor is used as the compressor of the refrigerator, the peak power at an initial operation can be reduced, and thus the operation of the refrigerator can be normally performed using the auxiliary power unit having the small capacity.

Therefore, it is possible to solve problems that the UPS device is damaged due to excessive driving power when a reciprocating compressor is used, or the compressor is not normally operated.

Fourth, since the input voltage is determined through the change in the voltage before and after the operation of the compressor, the type of the input voltage can be accurately determined, regardless of a type of the UPS device.

In particular, the third harmonic wave having a constant value is output according to supplying of the same current during the initial operation of the inverter compressor, and thus the type of the input voltage can be determined using a difference in the amplitude of the third harmonic wave before the driving of the inverter compressor and at the initial operation thereof. Therefore, even in a situation in which a variety of power is supplied and the power supply is unstable, the input power can be accurately determined, and thus the operation of the refrigerator can be reliably performed.

DESCRIPTION OF DRAWINGS

FIG. 1 is a view schematically illustrating a service environment of a refrigerator according to an embodiment of the present invention.

FIG. 2 is a block diagram illustrating a power connection state of the refrigerator.

FIG. 3 is a block diagram illustrating a flow of power and a signal for determining the power of the refrigerator.

FIG. 4 is a view illustrating a change in a waveform of a voltage and amplitude of a third harmonic wave when auxiliary power is input.

FIG. 5 is a flowchart sequentially illustrating a first embodiment of a process of determining input power.

FIG. 6 is a flowchart sequentially illustrating a second embodiment of the process of determining the input power.

FIG. 7 is a view illustrating a distortion of the waveform of the voltage and a change in zero crossing when the auxiliary power is input.

FIG. 8 is a flowchart sequentially illustrating a third embodiment of the process of determining the input power.

FIG. 9 is a view illustrating a change in the waveform of the voltage according to an operation of a compressor while the auxiliary power is supplied.

FIG. 10 is a flowchart sequentially illustrating a fourth embodiment of the process of determining the input power.

FIG. 11 is a view illustrating a change in the third harmonic wave according to the operation of the compressor while the auxiliary power is supplied.

FIG. 12 is a flowchart sequentially illustrating a fifth embodiment of the process of determining the input power.

FIG. 13 is a block diagram illustrating the flow of the signal between a control part of the refrigerator and elements connected to the control part.

FIG. 14 is a view illustrating a change in a temperature and a power consumption when the refrigerator performs a normal operation and a power-saving operation.

FIG. 15 is a view illustrating a change in a driving state of the compressor when the refrigerator performs the normal operation and the power-saving operation.

MODE FOR INVENTION

Hereinafter, exemplary embodiments of the present invention will be described with reference to the drawings. The invention may, however, be embodied in many different forms and should not be construed as being limited to the embodiments set forth herein; rather, alternative embodiments included in other retrogressive inventions or falling within the spirit and scope of the present disclosure can easily be derived through adding, altering, and removing, and will fully convey the concept of the invention to those skilled in the art.

That is, for explanation and convenience of understanding, an embodiment of the present invention describes an example of a top-mount type refrigerator in which a freezer compartment is provided at an upper side thereof, but the present invention is not limited to such a structure.

FIG. 1 is a view schematically illustrating a service environment of a refrigerator according to an embodiment of the present invention.

As illustrated in the drawing, a power outage in which commercial power 1 supplied to home is cut off frequently occurs in an area in which an electric power condition is unstable. To continuously use a home appliance in a situation like this, an uninterruptible power supply (UPS) device 3 may be provided at home, and the home appliance is used while being connected thereto.

The UPS device 3 may be referred to as a non-interrupting electric power supply, and is a device which prevents a power supply abnormality due to a voltage fluctuation, a frequency variation, a momentary power outage, a transient voltage or the like when the commercial electric power or an auxiliary power is used, and always stably supplies electric power to the connected home appliance.

The UPS device 3 may be usually used at a place in which the electric power condition is unstable. In particular, the UPS device 3 may be connected to the home appliance, and may enable the home appliance to be normally operated even when the power outage occurs.

And if necessary, in a normal situation other than the power outage situation, when a condition that a user has set up is satisfied, the UPS device 3 may control such that the power supplied to the refrigerator 10 is switched from the commercial power to the auxiliary power.

For example, in a case where a peak time at which a large amount of electric power is consumed is input by the user to the UPS device 3, the power supplied to the refrigerator 10 may be switched from the commercial power to the auxiliary power by the UPS device 3, when the peak time starts. When the peak time is ended, the power supplied to the refrigerator 10 may be switched again from the auxiliary power to the commercial power. Of course, the condition to switch the power supplied to the refrigerator 10 may be directly set by the user in the UPS device 3 by manipulatingge an command input device, or may be set through the refrigerator 10 which is located apart from the UPS device 3 and can communicate wirelessly or wirely with the UPS device 3, or a terminal which can communicate wirelessly or wirely with the UPS device 3. Also, instead of the user, a server of an electric power company may directly set the peak time in the UPS device 3.

Meanwhile, the commercial power 1 supplied to home may be directly connected to an electrical outlet 2 of a wall surface or to be connected to the UPS device 3 which is separately provided. And the UPS device 3 has an auxiliary power unit 4. And the auxiliary power unit 4 may be charged by the commercial power 1 while the commercial power 1 is supplied.

While the commercial power 1 is cut off, power (hereinafter, referred to as auxiliary power) supplied from the auxiliary power unit 4 is supplied to the home appliance through the UPS device 3. A chargeable battery may be used as the auxiliary power unit 4, and if necessary, various power units 4, such as an energy storage unit, a solar heat (light) cell and an independent generator, which can be replaced with the commercial power 1 and can be used at home may be used.

The UPS device 3 may be connected to an electrical outlet 5 of an indoor wall surface, and if necessary, an electrical outlet may be directly provided at the UPS device 3.

Meanwhile, a refrigerator 10 according to the embodiment of the present invention has a power plug 11, and the power plug 11 may be a common plug which is connected to the electrical outlet 2 which is directly connected to the commercial power 1, or connected to the electrical outlet 5 which is connected to the UPS device 3 according to a user?choice.

Therefore, when the user wants to operate the refrigerator 10 only with the commercial power 1, the power plug 11 is put into the electrical outlet 2 which is directly connected to the commercial power 1. And when the user wants to stably operate the refrigerator 10 with the auxiliary power even during the power outage in which the commercial power 1 is cut off, the power plug 11 is put into the electrical outlet 5 which is connected to the UPS device 3.

FIG. 2 is a block diagram illustrating a power connection state of the refrigerator. As illustrated in the drawing, the refrigerator 10 may be connected to the UPS device 3 so as to be operated even in a power outage situation, and thus may receive the commercial power 1 and the auxiliary power according to the situation.

As illustrated in FIG. 2a, while the commercial power 1 is normally supplied, the commercial power 1 may be supplied to the refrigerator 10 through the UPS device 3. Therefore, the refrigerator 10 may be operated in a normal operation mode which is usually operated. And when the chargeable battery is used as the auxiliary power unit 4, the auxiliary power unit 4 connected to the UPS device 3 may be charged by the commercial power 1 supplied to the UPS device 3.

And as illustrated in FIG. 2b, in a state in which the commercial power 1 is cut off, the auxiliary power may be supplied to the refrigerator 10 through the UPS device 3. Due to supplying of the auxiliary power, the refrigerator 10 may perform a cooling operation even in the power outage situation. And while the auxiliary power is supplied, the commercial power 1 may be supplied again, or the refrigerator 10 may be operated in a power-saving operation mode, which is operated with low power consumption, until the auxiliary power unit 4 is completely discharged.

Meanwhile, the UPS device 3 and the auxiliary power unit 4 may be integrally formed with the refrigerator 10. Alternatively, the UPS device 3 may have a structure which is provided in a machinery compartment in which a compressor 105 or the like is provided, or accommodated in a separate case and then connected to the refrigerator 10.

FIG. 3 is a block diagram illustrating a flow of the power and a signal for determining the power of the refrigerator.

As illustrated in the drawing, the refrigerator 10 may include a power input part 101 which is connected to the power plug 11, a voltage sensor 102 which senses an input voltage, a rectifying part 103 which receives and rectifies an input AC voltage, an inverter part 104 which provides the AC voltage converted according to a control signal to the compressor 105, and a control part 200 which controls an operation of the refrigerator 10.

And in a flow of the power input to the refrigerator 10, the power input to the refrigerator 10 through the power plug 11 is supplied to the compressor 105 through the power input part 101, the voltage sensor 102, the rectifying part 103 and the inverter part 104, and thus the compressor 105 may be driven.

That is, the voltage sensor 102 is located on a power line through which the power input from the power plug 11 is supplied to the compressor 105 to drive the compressor 105. The voltage sensor 102 may sense a voltage of the power supplied to the compressor 105.

In a flow of a signal according to a power input, first, the power input through the power plug 11 is supplied to the refrigerator through the power input part 101. The power input part 101 may be a connector on a PCB, and if necessary, may be formed to be connected to a noise filter, a fuse or the like. And the voltage sensor 102 senses the voltage of the power input through the power input part 101. And information of the sensed voltage may be supplied to the control part 200.

The control part 200 may include a comp microcomputer 201 and a main microcomputer 202. The comp microcomputer 201 may control driving of the compressor 105, and the main microcomputer 202 may control various electronic components such as a cooling fan 301, a display 302, a temperature sensor 303 and a defrosting heater 304, and may determine an entire operation mode of the refrigerator 10.

The comp microcomputer 201 and the main microcomputer 202 are connected by a photo-coupler, and formed to transmit and receive a signal in an insulated state, and may protect the electronic components connected to the main microcomputer 202 from a high voltage or an over-voltage.

Of course, the comp microcomputer 201 and the main microcomputer 202 may be integrally formed, and may be formed so that the electronic components including the voltage sensor 102 and the compressor are connected thereto.

Meanwhile, the comp microcomputer 201 may receive and process the voltage information from the voltage sensor 102. That is, the comp microcomputer 201 may calculate a waveform or a third harmonic wave through the voltage information input from the voltage sensor 102. And the comp microcomputer 201 may determine whether the input power is the commercial power 1 or the auxiliary power through the information input from the voltage sensor 102.

A signal of the commercial power 1 or the auxiliary power determined by the comp microcomputer 201 may be transmitted to the main microcomputer 202, and the normal operation mode or the power-saving operation mode is determined according to the signal input to the main microcomputer 202, and each of the electronic components including the compressor 105 is controlled according to the determined operation mode.

And the main microcomputer 202 may transmit an operation signal of the compressor 105 to the comp microcomputer 201 according to the determined operation mode. The comp microcomputer 201 drives the compressor 105 according to the operation signal of the compressor 105 transmitted from the main microcomputer 202.

And since the compressor 105 is an inverter type compressor of which a rotating speed is varied according to a load, the power at an initial operation may be lowered. Therefore, peak power at the initial operation of the compressor 105 may be lowered, and thus the refrigerator 10 may be smoothly operated with the auxiliary power.

However, when the compressor 105 is a general compressor 105 instead of the inverter type, the electric power at the initial operation is high, and a product having a high capacity auxiliary power unit 4 should be used. When a capacity of the auxiliary power unit 4 is small, the UPS device 3 may be damaged, or the compressor 105 may not be normally operated.

Hereinafter, various methods of determining the input power in the refrigerator 10 will be described in detail with reference to the drawings.

FIG. 4 is a view illustrating a change in the waveform of the voltage and amplitude of the third harmonic wave when auxiliary power is input.

As illustrated in FIG. 4a, when the commercial power 1 is input, a waveform of a sine wave is output by its own waveform of the commercial power 1. And at a point of time $t_1$ when the commercial power 1 is cut off and changed into the auxiliary power, the waveform is changed into a waveform of a square wave due to a characteristic of the UPS device 3. That is, when the commercial power 1 is cut off and thus the auxiliary power is input, the waveform of the sine wave is changed into the waveform of the square wave together with a change in the power.

And as illustrated in FIG. 4b, when amplitude of each of the third harmonic waves before and after the point of time $t_1$ when the power is changed is compared, it may be understood that the amplitude of the third harmonic wave when the auxiliary power is input is remarkably greater than that of the third harmonic wave when the commercial power 1 is input.

Therefore, a type of the input voltage may be recognized by the amplitude of the third harmonic wave or the change in the entire waveform of the input voltage.

FIG. 5 is a flowchart sequentially illustrating a first embodiment of a process of determining the input power.

As illustrated in the drawing, when the operation of the refrigerator 10 starts, the voltage sensor 102 senses the voltage of the power input through the power input part 101. And the comp microcomputer 201 may confirm the waveform of the input voltage through the signal transmitted from the voltage sensor 102.

When the waveform of the input voltage is maintained in the sine wave, the comp microcomputer 201 determines that the commercial power 1 is input. And the comp microcomputer 201 transmits an input signal of the commercial power 1 to the main microcomputer 202, and thus the normal operation is performed.

When the waveform of the input voltage is changed from the sine wave to the square wave, the comp microcomputer 201 determines that the auxiliary power is input. And the comp microcomputer 201 transmits an input signal of the auxiliary power to the main microcomputer 202, and thus the power-saving operation is performed.

FIG. 6 is a flowchart sequentially illustrating a second embodiment of the process of determining the input power.

As illustrated in the drawing, when the operation of the refrigerator 10 starts, the voltage sensor 102 senses the voltage of the power input through the power input part 101. And the comp microcomputer 201 may calculate the third harmonic wave of the input voltage using the signal transmitted from the voltage sensor 102.

When the amplitude of the third harmonic wave is less than a predetermined value, the comp microcomputer 201 determines that the input voltage is the commercial power 1. And the when the amplitude of the third harmonic wave is the predetermined value or more, the comp microcomputer 201 determines that the input voltage is the auxiliary power.

At this point, since a size of the third harmonic wave of the commercial power 1 is remarkably different from that of the third harmonic wave of the auxiliary power, it is possible to accurately determine an input of the auxiliary power without an error.

Meanwhile, when the comp microcomputer 201 determines that the commercial power is input, the comp microcomputer 201 transmits the input signal of the commercial power to the main microcomputer 202, and the normal operation is performed.

And when the comp microcomputer 201 determines that the auxiliary power is input, the comp microcomputer 201 transmits the input signal of the auxiliary power to the main microcomputer 202, and the power-saving operation is performed.

Meanwhile, not all UPS devices 3 output the waveform of the voltage in the form of the square wave. In the case of a high-priced or high performance UPS device 3, the waveform of the voltage is output in the form of the sine wave.

When the UPS device 3 outputs the waveform of the voltage in the form of the sine wave, it is not possible to recognize whether the auxiliary power is input through only the change into the square wave or a value of the third harmonic wave. Therefore, the UPS device 3 which outputs the waveform of the voltage in the form of the sine wave may determine whether the auxiliary power is input through another process.

FIG. 7 is a view illustrating a distortion of the waveform of the voltage and a change in zero crossing when the auxiliary power is input.

As illustrated in the drawing, when the UPS device 3 which outputs the sine wave is used, it may be understood that the waveform of the sine wave is output when the commercial power 1 is input and when the auxiliary power is input.

The waveform of the sine wave is output even in the auxiliary power, but it may be understood that the waveform is partially different from the previous waveform when comparing with the previous waveform at a point of time $t_2$ when the commercial power 1 is changed into the auxiliary power.

As illustrated in FIG. 7a, it may be understood that, even when the commercial power 1 is changed into the auxiliary power, the sine wave is generally output, but the waveform at the point of time $t_2$ when the power is changed is not continuous with the previous waveform.

Alternatively, as illustrated in FIG. 7b, it may be understood that, even when the commercial power 1 is changed into the auxiliary power, the sine wave is generally output, but a zero crossing period of the waveform is changed at the point of time $t_2$ when the power is changed.

Therefore, the change in the input voltage may be determined through a moment that the waveform of the voltage is partially changed.

FIG. 8 is a flowchart sequentially illustrating a third embodiment of the process of determining the input power.

As illustrated in the drawing, when the operation of the refrigerator 10 starts, the voltage sensor 102 senses the voltage of the power input through the power input part 101. And the comp microcomputer 201 may confirm the waveform of the input voltage through the signal transmitted from the voltage sensor 102.

When the waveform of the input voltage is continuously maintained in the sine wave without a temporary change, the comp microcomputer 201 determines that the commercial power 1 is input. And the comp microcomputer 201 transmits the input signal of the commercial power 1 to the main microcomputer 202, and thus the normal operation is performed.

If the waveform of the input voltage is partially changed at the certain point of time $t_2$, and is not continuous, or the zero crossing period is changed, the comp microcomputer 201 determines that the auxiliary power is input. And the comp microcomputer 201 transmits the input signal of the auxiliary power to the main microcomputer 202, and thus the power-saving operation is performed.

The partial change in the waveform at the point of time when the power is changed is caused by a performance characteristic of the UPS device 3, and a degree of the change may be changed according to performance of the UPS device 3. That is, in the high performance UPS device 3, even the partial change in the waveform may not occur, or a degree of the change which cannot be confirmed may occur.

Therefore, when the high performance UPS 3 in which the waveform of the sine wave is output upon the change in the input voltage and the partial change in the waveform cannot be confirmed is used, whether the auxiliary power is input may be determined through another process.

FIG. 9 is a view illustrating a change in the waveform of the voltage according to an operation of the compressor while the auxiliary power is supplied.

FIG. 9a illustrates the change in the waveform of the voltage according to an operation of the compressor 105 when the commercial power 1 is input. As illustrated in the drawing, when the commercial power 1 is input, it may be understood that the same waveform is maintained regardless of ON/OFF of the compressor 105.

And FIG. 9b illustrates the change in the waveform of the voltage according to the operation of the compressor 105 when the auxiliary power is input. As illustrated in the drawing, when the auxiliary power is input, it may be understood that a peak value is dropped in an ON state of the compressor 105.

Such a difference in the waveform is caused by a difference in output impedance with respect to the commercial power 1 and the auxiliary power, and this is because the output impedance of the auxiliary power is considerably larger than that of the commercial power 1.

That is, since a transformer for the commercial power 1 is considerably larger than that of the auxiliary power, the waveform of the input power before and after the operation of the compressor 105 is the same, as illustrated in FIG. 9a, and a drop of the peak value does not occur. However, since the transformer of the auxiliary power has a relatively small capacity, the peak value of the waveform of the input voltage after the operation of the compressor 105 is dropped further than that of the waveform of the input voltage before the operation of the compressor 105, as illustrated in FIG. 9b.

Therefore, the type of the input voltage may be determined through whether the peak value of the waveform of the input voltage before and after the operation of the compressor 105 is dropped.

FIG. 10 is a flowchart sequentially illustrating a fourth embodiment of the process of determining the input power.

As illustrated in the drawing, when the operation of the refrigerator 10 starts, the voltage sensor 102 senses the voltage of the power input through the power input part 101. And the comp microcomputer 201 confirms the waveform of the input voltage using the signal transmitted from the voltage sensor 102.

When the waveform of the input voltage is the square wave, it may be determined that the input power is auxiliary power regardless of the operation of the compressor.

That is, when it is confirmed that the waveform of the input voltage is the square wave, the comp microcomputer 201 primarily determines that the input voltage is the voltage of the auxiliary power unit 4. When the waveform of the input voltage is not the square wave, but the sine wave, the comp microcomputer 201 primarily determines that the input voltage is the voltage of the commercial power 1 or the UPS device 3 outputs the sine wave, and stands by until the compressor 105 is operated. Of course, at this point, sensing of the voltage through the voltage sensor 102 is continuously performed.

When the compressor 105 is operated, the comp microcomputer 201 compares the waveforms before and after the operation of the compressor 105, and confirms whether the peak value is dropped.

When the peak value of the waveform of the input voltage upon the operation of the compressor 105 is dropped further than that of the waveform of the input voltage before the operation of the compressor 105, the comp microcomputer 201 secondarily determines that the auxiliary power is input.

And when it is determined that the auxiliary power is input, the comp microcomputer 201 transmits an auxiliary power determining signal to the main microcomputer 202, and thus the main microcomputer 202 outputs an operation signal for the power-saving operation.

However, the peak value of the waveform of the input voltage upon the operation of the compressor 105 is not dropped further than that of the waveform of the input voltage before the operation of the compressor 105, and the waveform of the input voltage before and after the operation of the compressor 105 is the same, the comp microcomputer 201 secondarily determines that the commercial power 1 is input.

And the comp microcomputer 201 transmits a commercial power determining signal to the main microcomputer 202, and thus the main microcomputer 202 outputs an operation signal for the normal operation.

Even when not only the UPS device 3 which outputs the square wave but also the high performance UPS device 3 which outputs the sine wave are used, the type of the input power may be determined through such a method.

And in a primary determination, whether the input power is the commercial power 1 or the auxiliary power may be determined using the amplitude of the third harmonic wave instead of the change in the waveform of the input voltage. That is, in the primary determination, when the amplitude of the third harmonic wave is equal to or greater than a predetermined value, it may be determined that the waveform of the input voltage is the square wave, and thus it may be determined that the auxiliary power is input.

The drop of the peak value of the waveform according to the input voltage before and after the operation of the compressor 105 may be confirmed in an environment in which the power is stably supplied. However, when the power is not constantly supplied, it may be difficult to determine the type of the input power through the drop of the peak value.

Therefore, in an environment in which the electric power condition is poor, whether the auxiliary power is input may be determined through another process.

FIG. 11 is a view illustrating a change in the third harmonic wave according to the operation of the compressor while the auxiliary power is supplied.

The compressor 105 is an inverter compressor, and the inverter compressor performs an initial operation just before an operation thereof. The initial operation is an operation for aligning a position of a rotor of the compressor 105. The same current (e.g., 2A) is always supplied at the initial operation so that the rotor is aligned. The compressor 105 may be smoothly driven through an alignment of the rotor.

And since the compressor 105 has a majority of a load current in the refrigerator 10, a change in the load current may be interpreted as a change in the operation of the compressor 105.

As illustrated in FIG. 11a, the load current is sharply increased at a moment when the operation of the compressor 105 starts, i.e., an initial starting moment. And during an initial starting section of the compressor 105, the load current is constantly maintained, and when the initial operation is completed and the operation of the compressor is stable, the load current is maintained in a slightly lowered level.

As illustrated in FIG. 11b, when the commercial power 1 is supplied, the amplitude of the third harmonic wave is not changed regardless of the change in the load current.

However, when the auxiliary power is input, the amplitude of the third harmonic wave is changed according to the change in the load current. That is, the amplitude of the third harmonic wave is also increased according to an increase in the load current at the initial operation of the compressor 105, and when the initial operation of the compressor 105 is terminated, and the load current is maintained in the lowered level, the amplitude of the third harmonic wave is also reduced correspondingly.

Therefore, the type of the input power may be determined through the change of the third harmonic wave before and after the operation of the compressor 105.

FIG. 12 is a flowchart sequentially illustrating a fifth embodiment of the process of determining the input power.

As illustrated in the drawing, when the operation of the refrigerator 10 starts, the voltage sensor 102 senses the voltage of the power input through the power input part 101. And the comp microcomputer 201 may calculate the third harmonic wave of the input voltage using the signal transmitted from the voltage sensor 102.

When the UPS device 3 outputs the square wave, the input power may be primarily determined through the amplitude of the third harmonic wave of the input voltage regardless of the operation of the compressor 105.

That is, when the calculated amplitude of the third harmonic wave is equal to or greater than a predetermined value, the comp microcomputer 201 determines that the input voltage is the voltage of the auxiliary power unit 4. When the calculated amplitude of the third harmonic wave is less than the predetermined value, the comp microcomputer 201 determines that the input voltage is the voltage of the commercial power 1 or the UPS device 3 outputs the sine wave, and stands by until the compressor 105 is driven. Of course, at this point, the sensing of the voltage through the voltage sensor 102 and calculation of the third harmonic wave may be continuously performed.

Like this, when the compressor 105 is operated, the comp microcomputer 201 confirms a change in the amplitude of the third harmonic wave before and after the operation of the compressor 105, and secondarily determines whether the input power is the commercial power 1 or the auxiliary power. At this point, when the amplitude of the third harmonic wave is increased, it is determined that the auxiliary power is input.

Of course, the change of the third harmonic wave may occur by driving of another element other than the compressor 105. However, since the compressor 105 has the majority of the load current of the refrigerator 10, a difference in the third harmonic wave between before and after the operation of the compressor 105 necessarily occurs by the predetermined value.

At this point, the predetermined value may be the amplitude of the third harmonic wave corresponding to a current value input upon the initial operation of the compressor 105. That is, the same load current is input at every initial operation of the compressor 105, and the corresponding amplitude of the third harmonic wave is also the same. Therefore, in the case in which the amplitude of the third harmonic wave at the initial operation of the compressor 105 is set as the predetermined value, when the change in the amplitude of the third harmonic wave occurs, the compressor is initially operated, and it may be determined that the auxiliary power is input.

Like this, since a difference in the amplitude of the third harmonic wave may be clearly confirmed regardless of a state of the supplied power, and the input power is determined by the amplitude of the third harmonic wave generated at the initial operation of the compressor 105, the type of the input voltage may be accurately determined even in a situation in which the power supply is not constant.

When the comp microcomputer 201 determines that the auxiliary power is input, the comp microcomputer 201 transmits the auxiliary power determining signal to the main microcomputer 202, and thus the main microcomputer 202 outputs the operation signal for the power-saving operation.

Meanwhile, when the amplitude of the third harmonic wave before and after the operation of the compressor 105 is constantly maintained without a change, the comp microcomputer 201 transmits the commercial power determining signal to the main microcomputer 202, and the main microcomputer 202 outputs the signal for the normal operation.

And in the primary determination, instead of the change in the amplitude of the third harmonic wave, whether the waveform before and after the operation of the compressor 105 is the square wave or the sine wave may be confirmed, and the primary determination may be performed.

Hereinafter, the operation of the refrigerator according to the embodiment of the present invention will be described in detail with reference to the drawings.

FIG. 13 is a block diagram illustrating the flow of the signal between a control part of the refrigerator and elements connected to the control part.

As illustrated in the drawing, in the refrigerator 10 in the normal operation mode in which the commercial power is supplied, driving of the compressor 105 and the cooling fan 301 is controlled by the temperature sensor 303 connected to the control part 200, and a temperature in the refrigerator may be maintained in a preset temperature. And when a defrosting operation is required, the defrosting operation is performed by driving the defrosting heater 304. Also, operation information of the refrigerator 10 may be displayed through the display 302.

And as described above, when it is determined through the voltage sensor 102 that the input power is the auxiliary power, the control part 200 performs the power-saving operation to reduce the power consumption. That is, when it is determined that the supplying of the commercial power 1 is cut off by the power outage, and the auxiliary power is supplied, the refrigerator 10 may be controlled to perform the power-saving operation mode.

A change in an operation state of the refrigerator 10 may be displayed to the user through the display 302, and a variety of information related to the power, such as a power outage state, an input state of the auxiliary power, and a remaining amount of the auxiliary power unit 4 may be output.

FIG. 14 is a view illustrating a change in the temperature and the power consumption when the refrigerator performs the normal operation and the power-saving operation. And FIG. 15 is a view illustrating a change in a driving state of the compressor when the refrigerator performs the normal operation and the power-saving operation.

As illustrated in the drawings, in the refrigerator 10 in the normal operation mode in which the commercial power is supplied, the compressor 105, the cooling fan 301 and the like may be driven to maintain a set temperature $D_1$ in the refrigerator.

And at a moment when the power supplied to the refrigerator 10 is changed to the auxiliary power unit 4, the operation of the refrigerator is switched to the power-saving operation mode. And at this point, a set temperature $D_2$ in the refrigerator is set higher than the set temperature $D_1$ in the normal operation mode.

Therefore, the elements such as the compressor 105 and the cooling fan 301, which are required for the cooling operation, are driven based on the set temperature $D_2$ which is set higher, and thus a driving time may be shortened, or a driving period may be increased.

Therefore, the power-saving operation mode may be performed with the power consumption lower than that in the normal operation mode, and the cooling operation may be performed with the auxiliary power using the auxiliary power unit 4 having a limited capacity.

More specifically, when the refrigerator is operated in the normal operation mode through supplying of the commercial power 1, the set temperature $D_1$ is set, and the temperature in the refrigerator is controlled between an upper limit temperature $D_{1H}$ and a lower limit temperature $D_{1L}$ within a preset range (e.g, ?° C.) based on the set temperature $D_1$.

That is, when the temperature in the refrigerator sensed by the temperature sensor 303 is more than the upper limit temperature $D_{1H}$, the operation of the compressor 105 starts. The temperature in the refrigerator starts to be reduced by the operation of the compressor 105, and the compressor 105 is continuously operated until the temperature in the refrigerator reaches the lower limit temperature $D_{1L}$.

After the temperature in the refrigerator reaches the lower limit temperature $D_{1L}$, the operation of the compressor 105 is stopped, and if the compressor 105 is continuously maintained in a stopped state, the temperature in the refrigerator is increased again. The compressor 105 is maintained in the stopped state until the temperature in the refrigerator reaches the upper limit temperature $D_{1H}$. When the temperature in the refrigerator reaches the upper limit temperature $D_{1H}$, the compressor 105 is operated again.

The compressor 105 may be turned on or off according to the temperature in the refrigerator so that the temperature in the refrigerator is maintained between the upper limit temperature $D_{1H}$ and the lower limit temperature $D_{1L}$.

Meanwhile, when the power outage in which the supplying of the commercial power 1 is cut off occurs while the refrigerator 10 is operated in the normal operation mode, the auxiliary power is supplied through the UPS device 3. And when the comp microcomputer 201 determines that the auxiliary power is supplied, the main microcomputer 202 controls the refrigerator 10 to be operated in the power-saving operation mode.

In the power-saving operation mode, the set temperature $D_2$ as a reference is higher than the set temperature $D_1$ in the normal operation mode. Therefore, a upper limit temperature $D_{2H}$ and a lower limit temperature $D_{2L}$ based on the set temperature $D_2$ are also higher than those in the normal operation mode.

In this state, when the temperature in the refrigerator sensed by the temperature sensor 303 is more than the upper limit temperature $D_{2H}$, the operation of the compressor 105 starts. The temperature in the refrigerator starts to be reduced by the operation of the compressor 105, and the compressor 105 is continuously operated until the temperature in the refrigerator reaches the lower limit temperature $D_{2L}$.

After the temperature in the refrigerator reaches the lower limit temperature $D_{2L}$, the operation of the compressor 105 is stopped, and if the compressor 105 is continuously maintained in the stopped state, the temperature in the refrigerator is increased again. The compressor 105 is maintained in the stopped state until the temperature in the refrigerator reaches the upper limit temperature $D_{2H}$. When the temperature in the refrigerator reaches the upper limit temperature $D_{2H}$, the compressor 105 is operated again.

Like this, in the power-saving operation mode, the compressor 105 may be turned on or off according to the temperature in the refrigerator so that temperature in the refrigerator is maintained between the upper limit temperature $D_{2H}$ and the lower limit temperature $D_{2L}$ which are newly set.

Meanwhile, in the power-saving operation mode, the set temperature $D_2$ in the refrigerator is set higher than the set temperature $D_1$ in the normal operation mode, and the upper limit temperature $D_{2H}$ and the lower limit temperature $D_{2L}$ are also set higher. That is, since a load for achieving a target temperature is relatively smaller, it is possible to rapidly reach the lower limit temperature $D_{2L}$, and thus a slope of a temperature drop is further increased.

Therefore, an operation time of the compressor 105 in the power-saving operation mode may be reduced further than that of the compressor 105 in the normal operation mode, and thus the power consumption may be saved. Of course, the cooling fan 301 other than the compressor 105 may also be controlled to be operated equally to the compressor 105.

Meanwhile, in the power-saving operation mode, the set temperature $D_2$ for the operation of the compressor 105 may be increased in stages as time passes. That is, the set temperature after a set time is set higher than the set temperature $D_2$ when the power-saving operation mode starts, and a change in the set temperature is increased in stages according to the set time.

Accordingly, in the power-saving operation mode, a driving time of the compressor 105 is reduced in stages. And as the power-saving operation mode is continued, the power consumption is also reduced in stages, and a use time of the auxiliary power unit 4 may be increased.

Meanwhile, in the normal operation mode, when a defrosting signal is input, the defrosting heater 304 is driven, and the defrosting operation is performed. When the defrosting operation is performed, the defrosting heater 304 is driven, and the compressor 105 is stopped.

In the normal operation mode, since the external power is continuously supplied, the power for the defrosting operation such as driving of the defrosting heater 304 may be sufficiently supplied, and thus the defrosting operation may be performed without limit.

However, in the power-saving operation mode, the defrosting heater 304 is not driven even when the defrosting signal is input. Also, the cooling fan 301 operated upon the defrosting operation or other elements such as the damper is not driven either, and thus the defrosting operation itself is omitted.

Since the auxiliary power supplied by the auxiliary power unit 4 is limited, the omitting of the defrosting operation restricts the driving of the defrosting heater 304, and prevents an increase in a load in the refrigerator due to the defrosting operation.

Although embodiments have been described with reference to a number of illustrative embodiments thereof, it will be understood by those skilled in the art that various changes in form and details may be made therein without departing from the spirit and scope of the invention as defined by the appended claims. Therefore, the preferred embodiments should be considered in a descriptive sense only and not for purposes of limitation, and also the technical scope of the invention is not limited to the embodiments. Furthermore, the present invention is defined not by the detailed description of the invention but by the appended claims, and all differences within the scope will be construed as being comprised in the present disclosure.

The invention claimed is:

1. A refrigerator comprising:
   a power input part connected to a UPS device which is connected to an auxiliary power source and a commercial power source and selectively supplies power;
   a compressor;
   a voltage sensor configured to sense a voltage input through the power input part; and
   a control part configured to analyze a voltage signal sensed by the voltage sensor and to determine whether the input power is commercial power or auxiliary power,
   wherein the control part performs a primary determination through an analysis of the sensed voltage signal, performs a secondary determination through the analysis of the voltage signal sensed before and after driving of the compressor when it is determined that the power is not the auxiliary power, and determines whether the input power is the commercial power or the auxiliary power.

2. The refrigerator of claim 1, wherein, in the primary determination, when a waveform of the voltage signal sensed by the voltage sensor is a square wave, the control part determines that the input power is the auxiliary power.

3. The refrigerator of claim 2, wherein, in the secondary determination, when a peak value of a voltage waveform of the compressor is dropped, the control part determines that the input power is the auxiliary power.

4. The refrigerator of claim 2, wherein, in the secondary determination, when amplitude of a third harmonic wave after the driving of the compressor is greater than that of the third harmonic wave before the driving of the compressor, the control part determines that the input power is the auxiliary power.

5. The refrigerator of claim 1, wherein, in the primary determination, when amplitude of a third harmonic wave of the voltage signal sensed by the voltage sensor is equal to or more than a predetermined value, the control part determines that the input power is the auxiliary power.

6. The refrigerator of claim 5, wherein, in the secondary determination, when a peak value of a voltage waveform of the compressor is dropped, the control part determines that the input power is the auxiliary power.

7. The refrigerator of claim 5, wherein, in the secondary determination, when the amplitude of the third harmonic wave after the driving of the compressor is greater than that of the third harmonic wave before the driving of the compressor, the control part determines that the input power is the auxiliary power.

8. The refrigerator of claim 1, wherein the compressor is an inverter compressor, and a point of time after the driving of the compressor is an initial operation time in which a position of a rotor is aligned when the driving of the compressor starts.

9. The refrigerator of claim 1, wherein the voltage sensor is supplied on a power line through which the power is supplied from the power input part to the compressor, and senses the voltage signal supplied to the compressor.

10. The refrigerator of claim 1, wherein, in the primary determination of the control part, when it is determined that the input power is the auxiliary power, the determination of the control part is terminated.

* * * * *